United States Patent
Ryu et al.

(10) Patent No.: US 8,710,736 B2
(45) Date of Patent: Apr. 29, 2014

(54) ORGANIC LIGHT EMITTING DISPLAY APPARATUS

(75) Inventors: Do-Hyung Ryu, Yongin (KR); Chun-Seok Ko, Yongin (KR); Sang-Soo Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 544 days.

(21) Appl. No.: 13/092,739

(22) Filed: Apr. 22, 2011

(65) Prior Publication Data

US 2012/0075261 A1 Mar. 29, 2012

(30) Foreign Application Priority Data

Sep. 24, 2010 (KR) ........................ 10-2010-0092856

(51) Int. Cl.
*H01L 51/52* (2006.01)

(52) U.S. Cl.
USPC ............................. 313/505; 313/504; 313/512

(58) Field of Classification Search
USPC .......................................... 313/504, 505, 512
See application file for complete search history.

(56) References Cited

U.S. PATENT DOCUMENTS

| 6,882,105 | B2 * | 4/2005 | Murakami et al. | 313/506 |
| 2009/0302760 | A1 * | 12/2009 | Tchakarov et al. | 313/512 |

FOREIGN PATENT DOCUMENTS

| JP | 2000-048952 | 2/2000 |
| KR | 10-2007-0068228 | 6/2007 |
| KR | 10-2007-0078425 | 7/2007 |
| KR | 10-2008-0096321 | 10/2008 |

* cited by examiner

*Primary Examiner* — Mary Ellen Bowman
(74) *Attorney, Agent, or Firm* — Robert E. Bushnell, Esq.

(57) ABSTRACT

An organic light emitting display (OLED) apparatus has an improved structure so as to decrease a capacitance load between a power line and a control signal line. The OLED display apparatus includes a first substrate on which a thin film transistor (TFT) and an organic light emitting diode are disposed; a second substrate facing towards and spaced apart from the first substrate; a power line via which a voltage is applied to the source and drain electrodes of the TFT, and to the second electrode of the OLED; and a control signal line providing a control signal to the embedded circuit so as to control timing for supplying current to the gate electrode of the TFT. The control signal line is laid-out at an outer portion of the first substrate with respect to a position of the power line.

14 Claims, 5 Drawing Sheets

ORGANIC LIGHT EMITTING DISPLAY APPARATUS

CLAIM OF PRIORITY

This application makes reference to, incorporates the same herein, and claims all benefits accruing under 35 U.S.C. §119 from an application earlier filed in the Korean Intellectual Property Office on 24 Sep. 2010 and there duly assigned Serial No. 10-2010-0092856.

BACKGROUND OF THE INVENTION

1. Field of the Invention

One embodiment of the present invention relates to an organic light emitting display apparatus, and more particularly, to an organic light emitting display apparatus having an improved layout between a power line and a control signal line.

2. Description of the Related Art

In general, an organic light emitting display apparatus includes a thin film transistor (TFT) and an organic light emitting diode (OLED). The OLED receives an adequate driving signal from the TFT, emits light, and then realizes desired images.

SUMMARY OF THE INVENTION

An embodiment of the present invention provides an organic light emitting display apparatus having an improved structure in which an overlap region between a power line and a control signal line is reduced, whereby a capacitance load decreases.

In accordance with an aspect of the present invention, an organic light emitting display apparatus may include a thin film transistor (TFT) comprising a gate electrode, and source and drain electrodes, and a first substrate comprising an embedded circuit for driving the TFT; a second substrate facing the first substrate; an organic light emitting diode (OLED) comprising a first electrode electrically connected to one of the source and drain electrodes, a second electrode facing towards the first electrode, and an emission layer interposed between the first electrode and the second electrode; a power line via which a voltage is applied to the source and drain electrodes of the TFT, and to the second electrode of the OLED; and a control signal line providing a control signal to the embedded circuit so as to control timing for supplying electric current to the gate electrode. The control signal line may be laid-out at an outer portion of the first substrate with respect to a position of the power line.

The power line may include a first power line connected to the source and drain electrodes of the TFT, and a second power line connected to the second electrode of the OLED.

The first power line may include a first power input unit disposed on a top surface of the second substrate which does not face the first substrate; a first penetration unit connected to the first power input unit and penetrating through the second substrate; a first short unit connected to the first penetration unit and interposed between the first and second substrates; and a first connection unit arranged on the first substrate so as to connect the first short unit and the source and drain electrodes of the TFT.

The organic light emitting display apparatus may further include a first sealing unit surrounding the OLED and being disposed between the first substrate and the second substrate, and a second sealing unit surrounding the first sealing unit, wherein the first short unit is disposed between the first sealing unit and the second sealing unit.

The second power line may include a second power input unit disposed on the top surface of the second substrate which does not face the first substrate; a second penetration unit connected to the second power input unit and penetrating through the second substrate; a second short unit connected to the second penetration unit and interposed between the first and second substrates; and a second connection unit arranged on the first substrate so as to connect the second short unit and the second electrode.

The organic light emitting display apparatus may further include a first sealing unit surrounding the OLED between the first substrate and the second substrate, and a second sealing unit surrounding the first sealing unit, wherein the second short unit is disposed between the first sealing unit and the second sealing unit.

The second power line may further include an encapsulation unit extending from the second penetration unit so as to cover a surface of the second substrate, wherein the surface of the second substrate faces the first substrate.

The second substrate may include a carbon plate.

The organic light emitting display apparatus may further include a driving circuit unit for transmitting the control signal to the embedded circuit via the control signal line, and a connection pad for connecting the driving circuit unit and the control signal line, wherein the connection pad is disposed at an outer portion of the power line on the first substrate.

The driving circuit unit may be electrically connected to the connection pad by having an anisotropic conductive film (ACF) interposed therebetween.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
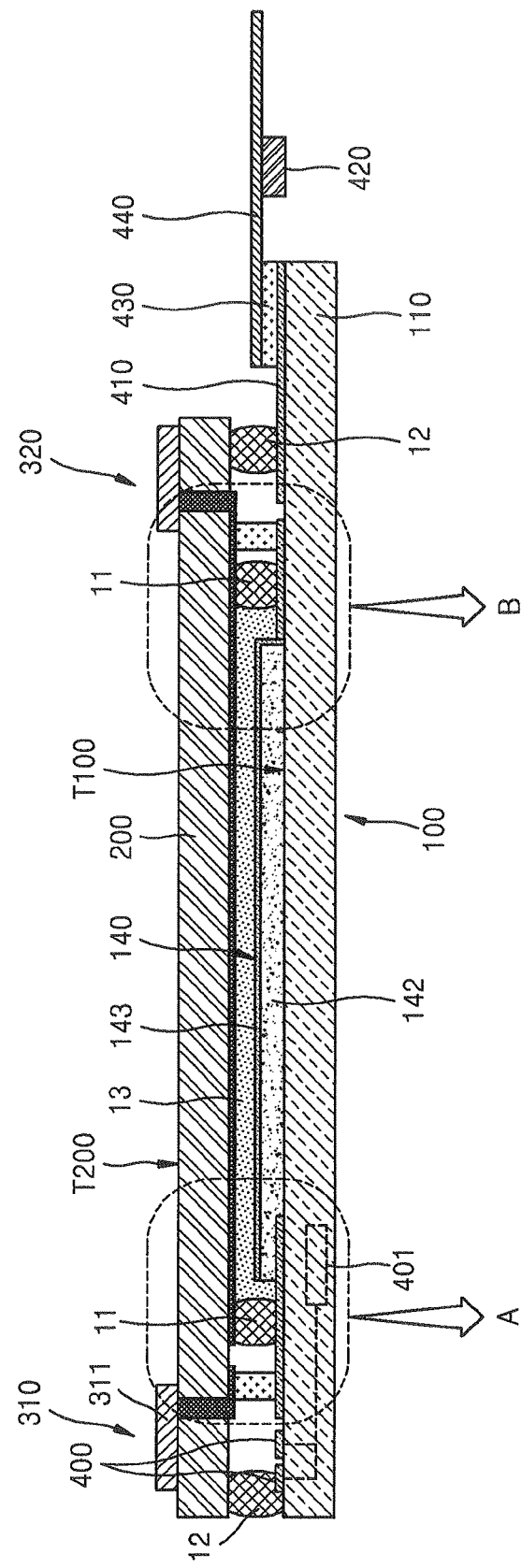
FIG. 1 is a cross-sectional view of an organic light emitting display apparatus constructed as an embodiment of the present invention.

In an OLED display apparatus, the TFT has a structure in which a gate electrode, an active layer, and source and drain electrodes are stacked on a substrate. When electric current is supplied to the gate electrode via a circuit embedded in the substrate, the electric current flows in the source and drain electrodes via the active layer, and simultaneously, the electric current flows in a pixel electrode of the OLED of the OLED display apparatus, which is electrically connected to the source and drain electrodes.

The OLED includes a pixel electrode, an opposite electrode facing towards the pixel electrode, and an emission layer interposed between the pixel electrode and the opposite electrode. In this structure of the OLED as described above, if electric current flows in the pixel electrode of the OLED via the TFT, an adequate voltage is generated between the opposite electrode and the pixel electrode, and then light emission occurs in the emission layer, so that an image may be realized.

The organic light emitting display apparatus includes a power line via which a voltage is applied to the source and drain electrodes of the TFT and to the opposite electrode of the OLED, and a control signal line providing an electrical signal to control timing when current is supplied to the gate electrode of the TFT.

In this regard, since current flows in both of the power line and the control signal line, if the power line and the control signal are overlapped in a plan view of the OLED display apparatus with only a very small gap therebetween, a partial capacitance load may be formed thereby interrupting an exact signal delivery. That is, a capacitance may be formed between the overlapping lines, such that a control signal delivery may be delayed, and then the control timing may not be exact.

In a contemporary OLED display apparatus, the lines are all laid-out on the substrate in which the TFT is embedded, such that a gap between the lines may narrow down to several micrometers (μms). When the lines overlap with each other in a plan view of the OLED display device with a gap of several micrometers, the control signal delivery is further delayed due to the capacitance load. In order to solve this problem, recently, a method has been proposed to reduce the overlapping region between the control signal line and the power line by disposing an input point of the control signal line at several different positions on a panel. This method however significantly complicates a structure of the organic light emitting display apparatus.

Therefore, there is a demand for a method of efficiently increasing the gap between the power line and the control signal line and reducing the overlapping region between these lines so as to ensure more exact emission control, while a structure of the organic light emitting display apparatus does not become significantly complex.

Hereinafter, the present invention will be described in detail by explaining exemplary embodiments of the invention with reference to the attached drawings.

Figure 2:
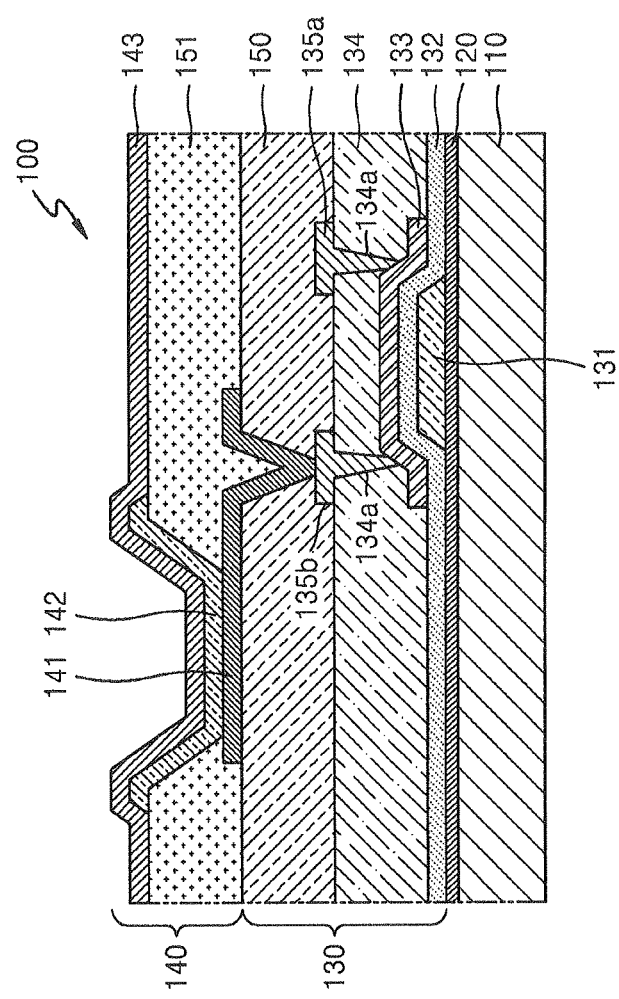
FIG. 2 illustrates a cross-sectional view of a thin film transistor (TFT) and an organic light emitting diode (OLED) included in the organic light emitting display apparatus of FIG. 1.

FIG. 1 is a cross-sectional view of an organic light emitting display apparatus constructed as an embodiment of the present invention. FIG. 2 illustrates cross-sectional views of a thin film transistor (TFT) and an organic light emitting diode (OLED) included in the organic light emitting display apparatus of FIG. 1.

As illustrated in FIGS. 1 and 2, the organic light emitting display apparatus includes a first substrate 100 including a thin film transistor (TFT) 130 (refer to FIG. 2), an embedded circuit 401 for driving the TFT 130, a second substrate 200 facing the first substrate 100, and an organic light emitting diode (OLED) 140 interposed between the first and second substrates 100 and 200. Reference numeral 13 of FIG. 1 indicates a moisture absorption filling material.

First, structures of the TFT 130 and the OLED 140 will now be briefly described with reference to FIG. 2. FIG. 2 illustrates one pixel in the organic light emitting display apparatus for convenience of explanation; however, the present invention is not limited thereto and a plurality of the pixels may be included. Also, a structure illustrated in FIG. 2 is an example of a stack structure of the TFT 130 and the OLED 140, and the structure may vary.

The OLED 140 is electrically connected with the TFT 130, thereby causing light emission. The OLED 140 includes a pixel electrode 141 (hereinafter, referred to as "first electrode 141") that is arranged in each pixel, an opposite electrode 143 (hereinafter, referred to as "second electrode 143") that is a common electrode, and an emission layer 142 that is interposed between the first electrode 141 and the second electrode 143. When a voltage is applied to the first electrode 141 from the TFT 130, and then an adequate voltage condition is formed between the first electrode 141 and the second electrode 143, emission occurs in the emission layer 142.

The emission layer 142 interposed between the first electrode 141 and the second electrode 143 may be formed by stacking all of or some of a hole injection layer (HIL), an emission layer (EML), an electron injecting and transporting layer, or the like. In this regard, the emission layer 142 at least includes the EML.

Although not illustrated in FIG. 2, a protective layer may further be formed on the second electrode 143.

Next, the TFT 130 includes a gate electrode 131 formed on a glass plate 110, a first insulating layer 132 covering the gate electrode 131, an active layer 133 formed on the first insulating layer 132, a second insulating layer 134 formed on the first insulating layer 132 so as to cover the active layer 133, and source and drain electrodes 135a and 135b connected to the active layer 133 via openings 134a in the second insulating layer 134.

In order to improve flatness, a buffer layer 120 may be formed on the glass plate 110 by using an inorganic material including silicon oxide.

The gate electrode 131 formed on the glass plate 110 may be a single layer or a multi-layer structure, which is formed of a conductive metal. The gate electrode 131 may include molybdenum (Mo).

The first insulating layer 132 may be formed of silicon oxide, tantalum oxide, or aluminum oxide but a material for forming the first insulating layer 132 is not limited thereto.

The patterned active layer 133 is formed on the first insulating layer 132. The active layer 133 may be formed of an oxide semiconductor that does not request a crystallization process and that is in an amorphous status, thereby having an excellent uniformity. For example, the active layer 133 may be a G-I-Z-O layer [a($In_2O_3$)b($Ga_2O_3$)c(ZnO) layer](where, a, b, c are actual numbers that satisfy a≥0, b≥0, c≥0, respectively), but is not limited thereto.

Afterward, the second insulating layer 134 is formed to cover the active layer 133. The second insulating layer 134 may also be formed of silicon oxide, tantalum oxide, or aluminum oxide but a material for forming the second insulating layer 134 is not limited thereto.

The source and drain electrodes 135a and 135b, which are made of an electrically conductive metal, are formed on the second insulating layer 134 so as to contact the active layer 133.

A passivation layer 150 is formed on the second insulating layer 134 so as to cover the source and drain electrodes 135a and 135b, and the first electrode 141 of the OLED 140 is formed on the passivation layer 150, wherein the first electrode 141 contacts the drain electrode 135b from among the source and drain electrodes 135a and 135b.

A pixel defining layer (PDL) 151 is formed on the passivation layer 150 and exposes a portion of the first electrode 141, and the emission layer 142 and the second electrode 143 are formed on the portion of the first electrode 141 which is exposed by the PDL 151.

In the present embodiment, the first substrate 100 includes layers from the glass plate 110 to the first electrode 141 and the PDL 151, and the emission layer 142 and the second electrode 143 of the OLED 140 are formed on the first substrate 100. That is, the TFT 130 and the embedded circuit 401 for driving the first electrode 141 and the TFT 130 are included in the first substrate 100, the emission layer 142 and the second electrode 143 are formed thereon, and the second substrate 200 that is an encapsulation substrate covers the OLED 140.

Thus, when current is supplied to the gate electrode 131 due to a driving operation by the embedded circuit 401, the active layer 133 conducts, so that current that is supplied to the source electrode 135a from among the source and drain electrodes 135a and 135b flows in the drain electrode 135b and the first electrode 141 via the active layer 133. Since an adequate voltage is constantly applied to the second electrode 143 via a second power line 320 to be described later, an adequate voltage is generated between the first and second electrodes 141 and 143, so that emission occurs in the emission layer 142.

To this end, it is necessary to arrange a first power line 310 via which a voltage is applied to the first electrode 141 via the source and drain electrodes 135a and 135b, and the second power line 320 via which a voltage is applied to the second electrode 143. Also, a control signal line 400 is necessary to transmit a clock signal to the embedded circuit 401, wherein the clock signal is used to set control timing by which the embedded circuit 401 supplies current to the gate electrode 131.

As discussed in the previous paragraph, however, when the lines, namely, the first and second power lines 310 and 320 and the control signal line 400 are simultaneously disposed on the first substrate 100 and are overlapped with a small gap therebetween on the first substrate 100, a capacitance load may be caused such that a control signal delivery may further be delayed. Therefore, in order to solve this problem, in the present embodiment, a layout of the lines, namely, the first and second power lines 310 and 320 and the control signal line 400 is configured as described as follows.

Figure 5:
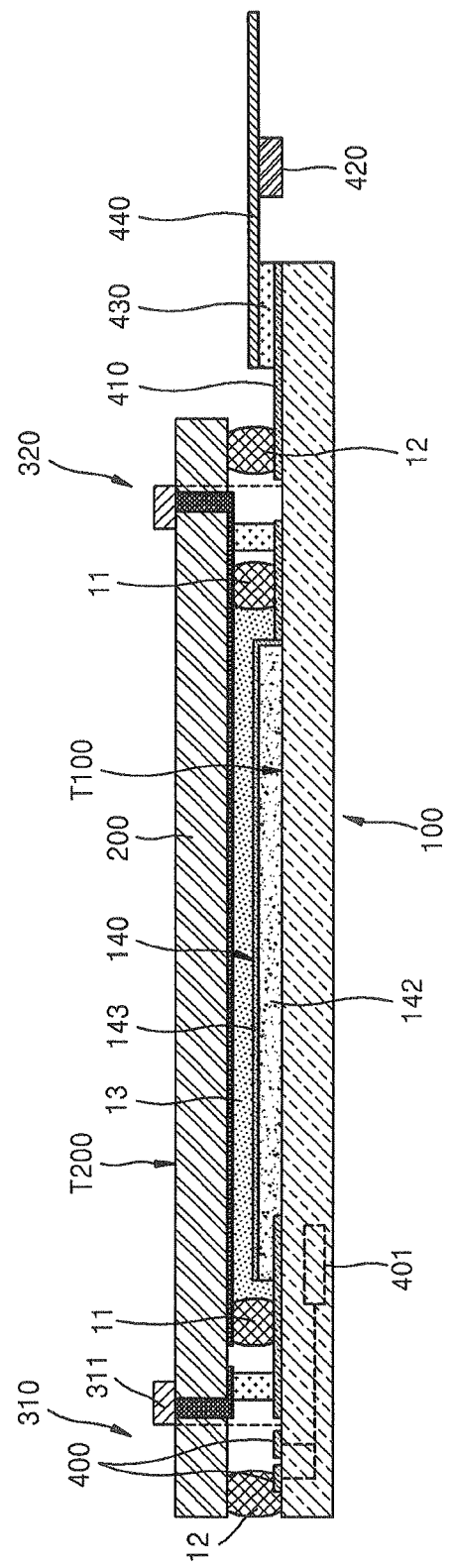
FIG. 5 is a cross-sectional view of an organic light emitting display apparatus constructed as another embodiment of the present invention.

First, as illustrated in FIG. 1, the control signal line 400 is laid-out at an outer portion of the first substrate 100 and the first and second power lines 310 and 320 are laid-out at an inner portion of the first substrate 100 in comparison with the control single line 400. This layout reduces an overlap region between the control signal line 400, and the first and second power lines 310 and 320 on the first substrate 100. As shown in FIG. 1, by laying-out the control signal line 400 at the outer portion of a major surface T100 of the first substrate 100, and then laying-out the first and second power lines 310 and 320 at inner portions, compared to the outer portion, the control signal line 400 and the first and second power lines 310 and 320 are not simultaneously formed on the first substrate 100, and the control signal line 400 is not overlapped on a path of the first and second power lines 310 and 320 on the first substrate 100. In an embodiment as shown in FIG. 5, the control signal line 400 is not overlapped with the first and second power lines 310 and 320 in a plan view of the OLED display device. Reference numeral 420 of FIG. 1 indicates a driving circuit unit for transmitting a control signal to the embedded circuit 401 via the control signal line 400, and reference numeral 410 of FIG. 1 indicates a connection pad for connecting the driving circuit unit 420 and the control signal line 400. The connection pad 410 is also disposed at an outer portion of the first substrate 100, and is connected to the control signal line 400 after circling along an outer side of the first substrate 100. That is, the connection between the connection pad 410 and the control signal line 400 is performed at the outer side of the first substrate 100 so as to reduce or avoid overlap with the first and second power lines 310 and 320. Reference numeral 440 of FIG. 1 indicates a flexible circuit board having the driving circuit unit 420 disposed thereon, and reference numeral 430 of FIG. 1 indicates an anisotropic conductive film (ACF) for connecting the flexible circuit board 440 and the connection pad 410.

Figure 3:
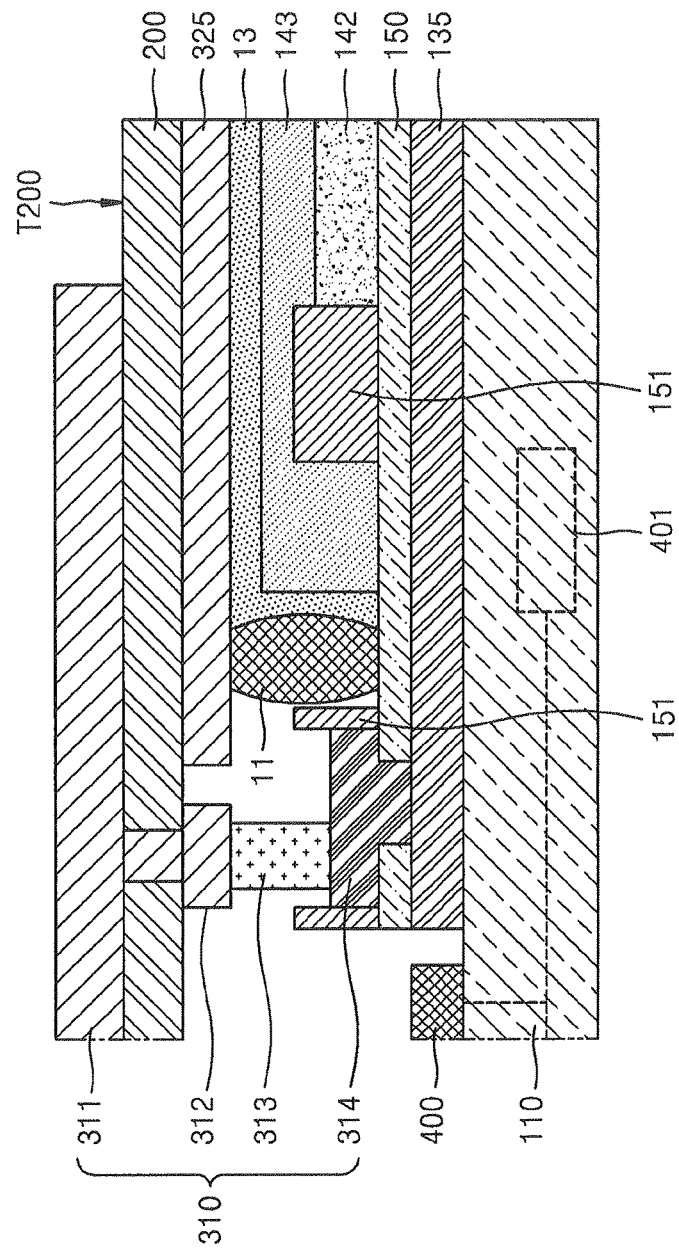
FIG. 3 is a magnified cross-sectional view of a portion A of FIG. 1.

Next, a structure of the first power line 310 from among the first and second power lines 310 and 320 will be first described with reference to FIGS. 1 and 3.

The first power line 310 is connected to the source electrode 135a from among the source and drain electrodes 135a and 135b so as to apply a voltage to the first electrode 141 of the OLED 140, and is formed of a conductive material including copper (Cu), aluminum (Al), indium tin oxide (ITO), silver (Ag), or the like. The first power line 310 is laid-out not only on the first substrate 100 but is laid-out to extend from the second substrate 200 to the first substrate 100. That is, when the control signal line 400 is laid-out on a portion of the first substrate 100, the first power line 310 is not laid-out on the portion but is formed on the second substrate 200, so that the control signal line 400 does not overlap with the first power line 310 on the same first substrate 100.

The first power line 310 has a structure in which a first power input unit 311, a first penetration unit 312, a first short unit 313, and a first connection unit 314 are sequentially connected, wherein the first power input unit 311 is disposed on a top surface T200 of the second substrate 200, which does not face the first substrate 100, the first penetration unit 312 penetrates through the second substrate 200, the first short unit 313 is interposed between the first and second substrates 100 and 200, and the first connection unit 314 is connected to the source and drain electrodes 135a and 135b. That is, the first power line 310 starts from the second substrate 200 and extends to the first substrate 100, and avoids contacting the control signal line 400. Reference numeral 135 of FIG. 3 indicates a source-drain contact unit connecting the source and drain electrodes 135a and 135b. By doing so, the control signal line 400 and the first power line 310 do not overlap on the first substrate 100, and then a capacitance load is not formed, so that a signal delivery may not be delayed. Referring to FIG. 1, it seems that the first power input unit 311 overlaps with the control signal line 400 in a plan view of the OLED display apparatus; however, the first power input unit 311 and the control signal line 400 are disposed on different substrates and are spaced apart from each other by a gap equal to the sum of a gap between the first and second substrates 100 and 200, and a thickness of the second substrate 200, so that the capacitance load is not formed. Therefore, the capacitance load which may be formed when lines overlap with each other by a gap within several on in the same first substrate 100, is prevented from occurring because the gap between the first power input unit 311 and the control signal line 400 exceeds several mm.

Thus, the present embodiment has a layout that eliminates a near overlap between the control signal line 400 and the first power line 310, so that the capacitance load may be resolved, and then a signal delivery delay with respect to a signal to control timing may be prevented.

Here, the second substrate 200 may be formed of a carbon plate, instead of glass, so as to easily form the first penetration unit 312 and a second penetration unit 322, to be described later, therein. The carbon plate may be formed by impregnating a plurality of carbon fibers into a resin matrix, wherein the carbon plate has the following characteristics.

First, a carbon fiber has a thermal expansion coefficient lower than a thermal expansion coefficient of a glass material, and the resin matrix has a thermal expansion coefficient greater than that of the glass material. In particular, a thermal expansion coefficient of the carbon fiber in a lengthwise direction has a negative value. Thus, by adjusting a ratio of the amount of the carbon fiber to the amount of the resin matrix, a thermal expansion coefficient of the second substrate 200 may be adjusted to a desired level.

Also, the carbon fiber does not absorb moisture, thereby having an excellent moisture-proof feature.

In addition, since a mechanical property of the carbon fiber is excellent, a larger mechanical robust feature may be achieved by a smaller thickness. Thus, the carbon fiber is advantageous in decreasing a total thickness of the organic light emitting display apparatus, and due to its small thickness, the first and second penetration units 312 and 322 may be easily formed.

The plurality of carbon fibers may be arranged in parallel to each other or may be arranged crossing each other at various angles.

Also, the second substrate 200 may have a structure in which a plurality of the carbon plates are stacked. Here, an arrangement direction of the plurality of carbon fibers in each layer of the stacked carbon plates may be the same or may vary so as to cross each other at various angles. For example, in a case where the second substrate 200 has a structure of four stacked carbon plates, carbon fibers in the first and fourth layers may be arranged in a first direction, and carbon fibers in the second and third layers may be arranged in a second direction different from the first direction. By varying the arrangement direction of the carbon fibers, flatness of the second substrate 200 may be improved.

The second substrate 200 may be formed by using the aforementioned carbon plate.

Reference numerals 11 and 12 of FIG. 1 respectively indicate a first sealing unit and a second sealing unit which surround the OLED 140, with the first short unit 313 arranged between the first and second sealing units 11 and 12.

Figure 4:
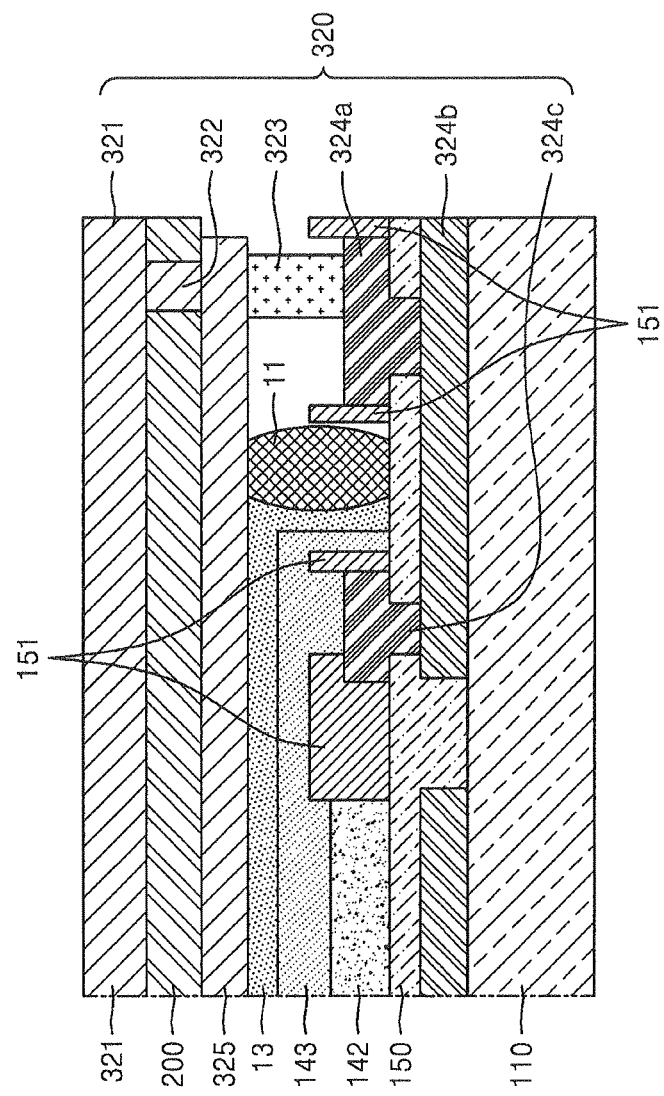
FIG. 4 is a magnified cross-sectional view of a portion B of FIG. 1.

Next, referring to FIGS. 1 and 4, the second power line 320 has a similar structure as the first power line 310.

The second power line 320 is connected to the second electrode 143 of the OLED 140, and is formed of an electrically conductive material including Cu, Al, ITO, Ag, or the like. The second power line 320 has a structure in which a second power input unit 321, the second penetration unit 322, a second short unit 323, and second connection units 324a, 324b, and 324c are sequentially connected, wherein the second power input unit 321 is disposed on the top surface T200 of the second substrate 200, which does not face the first substrate 100, the second penetration unit 322 penetrates through the second substrate 200, the second short unit 323 is interposed between the first and second substrates 100 and 200, and the second connection units 324a, 324b, and 324c are connected to the second electrode 143. That is, the second power line 320 starts from the second substrate 200 and extends to the first substrate 100 and avoids contacting the connection pad 410 of the control signal line 400. By doing so, the control signal line 400 and the second power line 320 do not overlap on the first substrate 100, and a capacitance load is not formed, so that a signal delivery may not be delayed. In the embodiment as shown in FIG. 5, the connection pad 410 and the second power line 320 do not overlap in a plan view of the OLED display apparatus. As is the case of the first short unit 313, the second short unit 323 is arranged between first and second sealing units 11 and 12.

Thus, embodiments of the present inventions reduce or even eliminate an overlap region between the control signal line 400 and the second power line 320, and increase the gap between the control signal line 400 and the second power line 320. Therefore, the capacitance load may be resolved, and a signal delivery delay with respect to a signal to control timing may be prevented.

Also, the second power line 320 further includes an encapsulation unit 325 extending from the second penetration unit 322 and functioning as a metal encapsulation layer for covering the surface of the second substrate 200, which faces the first substrate 100.

As described above, the organic light emitting display apparatus constructed with the embodiments of the present invention has an improved layout in which the first and second power lines 310 and 320, and the control signal line 400 are not simultaneously disposed on and do not overlap on the first substrate 100, so that the capacitance load may not be formed, and a control signal delivery may not be delayed.

According to the organic light emitting display apparatus, an overlap region between the power line and the control signal line is significantly reduced, whereby a control timing delay due to the capacitance load between lines may be resolved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting display apparatus, comprising:
a thin film transistor (TFT) comprising a gate electrode, and source and drain electrodes, and a first substrate comprising an embedded circuit for driving the TFT;
a second substrate facing the first substrate;
an organic light emitting diode (OLED) comprising a first electrode electrically connected to one of the source and drain electrodes of the TFT, a second electrode facing the first electrode, and an emission layer interposed between the first electrode and the second electrode;
a power line via which a voltage is applied to one of the source and drain electrodes of the TFT, and to the second electrode of the OLED; and
a control signal line providing a control signal to the embedded circuit so as to control timing for supplying current to the gate electrode of the TFT,
wherein the control signal line is laid-out at an outer portion of the first substrate with respect to a position of the power line.

2. The organic light emitting display apparatus of claim 1, wherein the power line comprises a first power line electrically connected to the source and drain electrodes of the TFT, and a second power line electrically connected to the second electrode to the OLED.

3. The organic light emitting display apparatus of claim 2, wherein the first power line comprises:
a first power input unit disposed on a top surface of the second substrate, with the top surface of the second substrate not facing the first substrate;
a first penetration unit connected to the first power input unit and penetrating through the second substrate;
a first short unit connected to the first penetration unit and interposed between the first and second substrates; and
a first connection unit arranged on the first substrate so as to connect the first short unit and the source and drain electrodes.

4. The organic light emitting display apparatus of claim 3, further comprising a first sealing unit surrounding the OLED between the first substrate and the second substrate, and a second sealing unit surrounding the first sealing unit, wherein the first short unit is disposed between the first sealing unit and the second sealing unit.

5. The organic light emitting display apparatus of claim 2, wherein the second power line comprises:
a second power input unit disposed on a top surface of the second substrate, with the top surface of the second substrate not facing the first substrate;
a second penetration unit connected to the second power input unit and penetrating through the second substrate;
a second short unit connected to the second penetration unit and interposed between the first and second substrates; and
a second connection unit arranged on the first substrate so as to connect the second short unit and the second electrode.

6. The organic light emitting display apparatus of claim 5, further comprising a first sealing unit surrounding the OLED between the first substrate and the second substrate, and a second sealing unit surrounding the first sealing unit, wherein the second short unit is disposed between the first sealing unit and the second sealing unit.

7. The organic light emitting display apparatus of claim 5, wherein the second power line further comprises an encapsulation unit extending from the second penetration unit so as to cover a second surface of the second substrate, wherein the second surface of the second substrate faces the first substrate.

8. The organic light emitting display apparatus of claim 2, wherein the second substrate comprises a carbon plate.

9. The organic light emitting display apparatus of claim 1, further comprising a driving circuit unit for transmitting the control signal to the embedded circuit via the control signal line, and a connection pad for electrically connecting the driving circuit unit and the control signal line,
wherein the connection pad is disposed at an outer portion of the power line on the first substrate with respect to the position of the power line.

10. The organic light emitting display apparatus of claim 9, wherein the driving circuit unit is electrically connected to the connection pad by having an anisotropic conductive film (ACF) interposed therebetween.

11. An organic light emitting display apparatus, comprising:
a first substrate including a thin film transistor (TFT) comprising a gate electrode and source and drain electrodes, an embedded circuit driving the TFT, and an organic light emitting display diode (OLED) comprising a first electrode electrically connected to the source and drain electrodes of the TFT and a second electrode facing the first electrode and an emission layer interposed between the first electrode and the second electrode;
a second substrate facing and spaced apart from the first substrate;
a power line via which a voltage is applied to the source and drain electrodes of the TFT, and to the second electrode of the OLED, and the power line extending from the second substrate to the first substrate; and
a control signal line providing a control signal to the embedded circuit so as to control timing for supplying current to the gate electrode, the control signal line being disposed on the first substrate, and the control signal line not overlapping with the power line in a plan view of the organic light emitting display apparatus.

12. The organic light emitting display apparatus of claim 11, wherein the power line comprises:
a power input unit disposed on a top surface of the second substrate, with the top surface of the second substrate not facing the first substrate;
a penetration unit connected to the second power input unit and penetrating through the second substrate;
a short unit connected to the second penetration unit and interposed between the first and second substrates; and
a connection unit arranged on the first substrate so as to connect the second short unit and the second electrode.

13. An organic light emitting display apparatus, comprising:
a first substrate including a thin film transistor (TFT) comprising a gate electrode and source and drain electrodes, an embedded circuit driving the TFT, and an organic light emitting display diode (OLED) comprising a first electrode electrically connected to the source and drain electrodes of the TFT and a second electrode facing the first electrode and an emission layer interposed between the first electrode and the second electrode;
a second substrate facing towards and spaced apart from the first substrate;
a power line via which a voltage is applied to the source and drain electrodes of the TFT, and to the second electrode of the OLED, and the power line extending from a first major surface of the second substrate towards a second major surface of the first substrate, with the first major surface of the second substrate facing towards an exterior of the organic light emitting display apparatus and the second major surface of the first substrate facing towards an interior of the organic light emitting display apparatus; and
a control signal line providing a control signal to the embedded circuit so as to control timing for supplying current to the gate electrode, and the control signal line being disposed on the second major surface of the first substrate.

14. The organic light emitting display apparatus of claim 13, wherein the power line comprises:
a power input unit disposed on a top surface of the second substrate, with the top surface of the second substrate not facing the first substrate;
a penetration unit connected to the second power input unit and penetrating through the second substrate;
a short unit connected to the second penetration unit and interposed between the first and second substrates; and
a connection unit arranged on the first substrate so as to connect the second short unit and the second electrode.

* * * * *